United States Patent
Lin et al.

(10) Patent No.: US 6,825,749 B1
(45) Date of Patent: Nov. 30, 2004

(54) SYMMETRIC CROSSOVER STRUCTURE OF TWO LINES FOR RF INTEGRATED CIRCUITS

(75) Inventors: Tser Yu Lin, Hsin-Chu (TW); Chin-Fong Chiu, Hsin-Chu (TW); Ying-Zong Juang, Tainan (TW); Chu-Jung Sha, Hsin-Chu (TW); Li-E Li, Hsin-Chu (TW)

(73) Assignee: National Applied Research Laboratories National Chip Implementation Center, Hsinchu (TW)

( * ) Notice: Subject to any disclaimer, the term of this patent is extended or adjusted under 35 U.S.C. 154(b) by 0 days.

(21) Appl. No.: 10/763,192

(22) Filed: Jan. 26, 2004

(51) Int. Cl.[7] .............................................. H01F 5/00
(52) U.S. Cl. ..................................................... 336/200
(58) Field of Search ........................... 336/65, 192, 200, 336/205–206, 232, 180–182

(56) References Cited

U.S. PATENT DOCUMENTS

| | | | | |
|---|---|---|---|---|
| 4,816,784 A | * | 3/1989 | Rabjohn | ................... 333/24 R |
| 4,992,769 A | * | 2/1991 | Oppelt | ........................ 336/180 |
| 6,476,704 B2 | * | 11/2002 | Goff | ............................ 336/200 |
| 6,577,219 B2 | * | 6/2003 | Visser | ........................ 336/200 |
| 6,580,334 B2 | * | 6/2003 | Simburger et al. | ......... 333/24 R |
| 6,707,367 B2 | * | 3/2004 | Castaneda et al. | .......... 336/200 |

* cited by examiner

*Primary Examiner*—Tuyen T. Nguyen
(74) *Attorney, Agent, or Firm*—Rosenberg, Klein & Lee

(57) ABSTRACT

In a symmetric crossover structure of two lines formed of a lower conductor layer and a higher conductor layer above a substrate, each of the two lines is branched to two routes at where they are crossed over to each other. The first route of the first line uses the higher layer to cross the first route of the second line and the lower layer to cross over the second route of the second line. The second route of the first line uses the lower layer to cross over the first route of the second line and the higher layer to cross over the second route of the second line. The two lines therefore have symmetric coupling effects to the substrate.

5 Claims, 11 Drawing Sheets

US 6,825,749 B1

SYMMETRIC CROSSOVER STRUCTURE OF TWO LINES FOR RF INTEGRATED CIRCUITS

FIELD OF THE INVENTION

The present invention relates generally to an integrated circuit (IC) inductor, and more particularly, to a symmetric crossover structure of two lines for radio frequency (RF) integrated circuits.

BACKGROUND OF THE INVENTION

A voltage-controlled oscillator (VCO) in a wireless transceiver typically employs phase-locked loop (PLL) to realize the tunable local oscillator (LO) signal. For the frequency spreading process and temperature variation thereof, the VCO is required to possess wider tunable range. In addition, in wireless communications, smaller silicon area, lower power consumption and lower noise all are desirable for the VCO design.

Recently, several proposed VCO's gain good noise performance, wider tunable rang and ultra low power consumption by use of bonding wire inductor. However, the bonding wire inductor may be not suitable for integration circuits. Although on-chip inductor is proposed alternatively, for one more inductors are needed for a VCO, it will require large occupied chip area when the on-chip inductor is applied in the VCO. To simultaneously improve the quality factors, such as noise performance, tunable rang and power consumption, and reduce the needed chip area, spiral inductor is proposed for the applications in a differential VCO.

FIG. 1 shows a conventional spiral inductor 10 which includes a conductor line wired in a spiral winding 12 with the most outside line segment 122 connected to an input 14 and the most inside line segment 124 connected to an output 18 by crossing over the spiral winding 12 with a line segment 16 through an higher or lower conductor layer. However, this inductor 10 is not suitable for a differential VCO due to its asymmetric device structure.

FIG. 2 shows a symmetric spiral inductor 20 which includes a spiral winding 22 and a crossover structure 24 composed of two lines 242 and 244 crossing over each other. Even this inductor 20 has its left and right half portions symmetric to the center line 26, the crossover structure 24 still has asymmetric factor. In particular, as shown in FIG. 3, two lines in a same conductor layer must have one of them, e.g., that one denoted by numeral 242, to cross over the other one 244 by jumping to either a lower or higher conductor layer at where they meet with each other, and as a result, high-frequency parasitic capacitors resulted from these two lines 242 and 244 to the substrate containing these two lines 242 and 244 are different due to their arrangement in different-level conductor layers, which then results in obviously asymmetric performance in the crossover structure 24 when such device is operated with high frequency.

In the balanced planar transformer disclosed in U.S. Pat. No. 4,816,784 issued to Rabjohn et al., two spiral inductors are formed by two crossover lines that are symmetric to the center thereof, while it is still asymmetric at the crossover portion of the two lines.

On the other hand, it is obvious to those skilled in the art that a single-layer spiral inductor is disadvantageous to provide large inductance, and to overcome this shortcoming, dual-layer spiral inductor is proposed. However, for the dual-layer spiral inductor is inherently asymmetric in its device structure thereof, the inductances seen from its input and output are different. To improve the shortcoming of the inductance and the asymmetric device structure for on-chip inductor, in U.S. Pat. No. 6,380,835 issued to Lee a symmetric multi-layer spiral inductor is proposed. However, the crossover portion of this spiral inductor is still asymmetric and its device structure is formed with multi-layer conductors, it is thus introduced of serious parasitic effect.

Therefore, it is desired a two lines inductor which has symmetric crossover structure thereof.

SUMMARY OF THE INVENTION

An object of the present invention is to provide a symmetric crossover structure of two lines for RF integrated circuits.

Another object of the present invention is to provide an inductor which has two lines crossover structure and it is symmetric.

In a symmetric crossover structure of two lines for RF integrated circuits, according to the present invention, each of the two lines is branched to two routes when they are crossing over each other, of which the first route of the first line uses a lower conductor layer to cross over the first route of the second line and an higher conductor layer to cross over the second route of the second line, and the second route of the first line uses the higher layer to cross over the first route of the second line and the lower layer to cross over the second route of the second line. As a result, the crossover portion of these two lines has a symmetric structure and thus substantially has parasitic effect in high frequency for these two lines.

BRIEF DESCRIPTION OF THE DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

Figure 1:
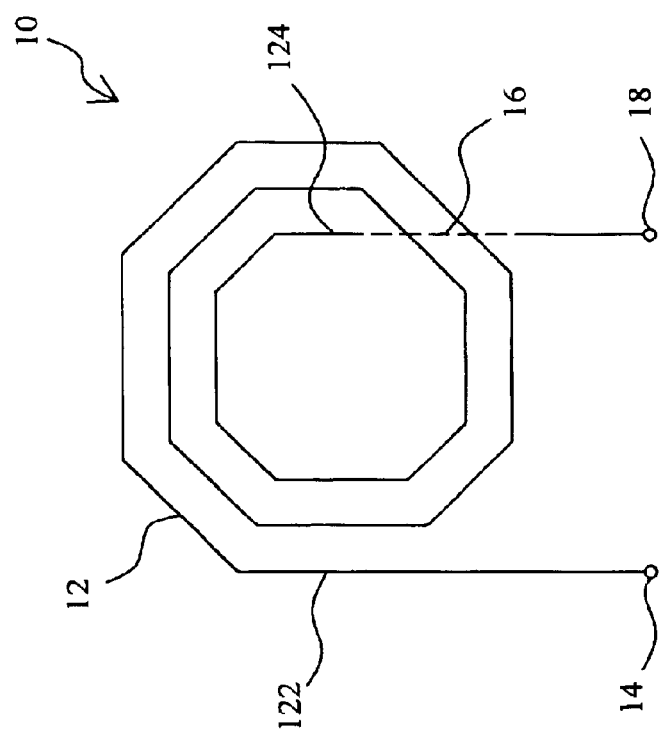
FIG. 1 shows a conventional spiral inductor.
Figure 2:
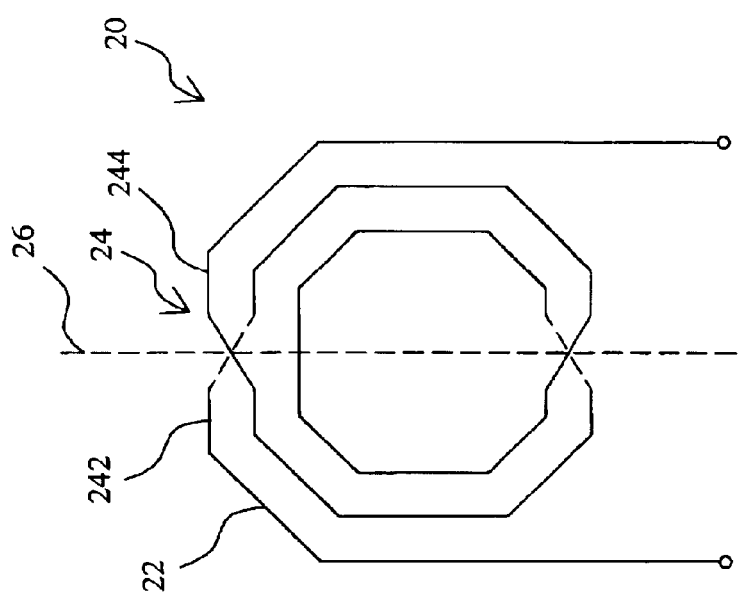
FIG. 2 shows a conventional spiral inductor which has symmetric structure.
Figure 3:
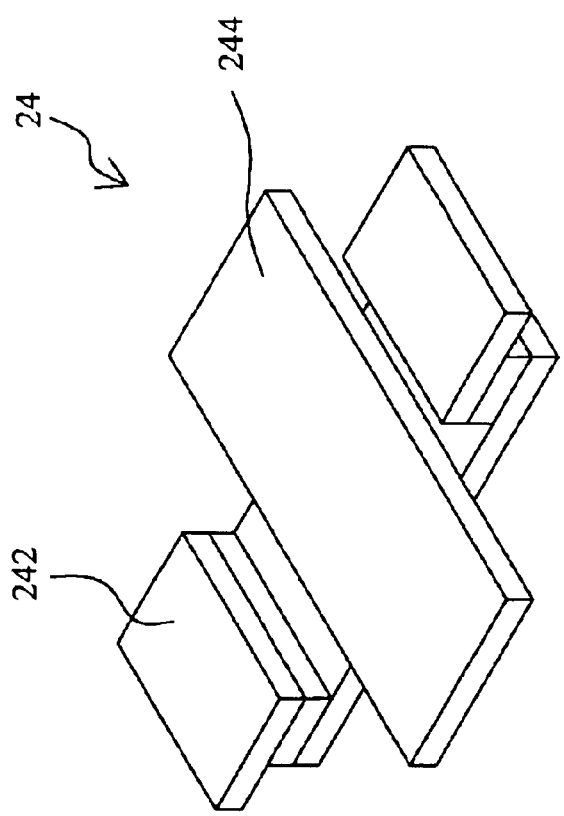
FIG. 3 shows the crossover structure of the inductor shown in FIG. 2.
Figure 4:
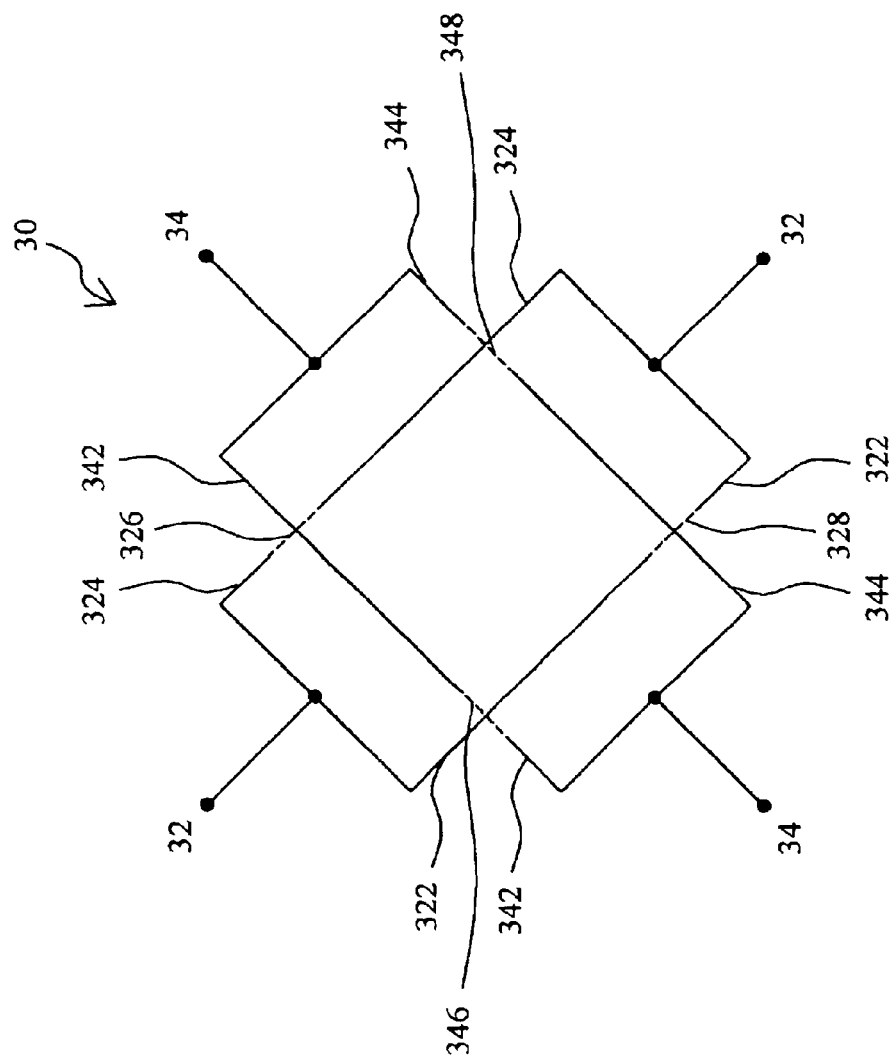
FIG. 4 shows a crossover structure of two lines according to the present invention in a simplified manner.

FIG. 4 shows a crossover structure 30 of two lines 32 and 34 in a simplified manner, according to the present invention, of which, when the two conductor lines 32 and 34 are crossing over each other, the line 32 is branched to two routes 322 and 324 and the other line 34 is branched to two routes 342 and 344. In this crossover structure 30, the route 322 of the line 32 crosses over the route 342 of the other line 34 by the higher conductor layer over the segment 346 of the route 342 and over the other route 344 of the line 34 by the segment 328 on the lower conductor layer 328 underlying the route 344 of the line 34, and the other route 324 of the first line 32 crosses over the first route 342 of the second line 34 by the segment 326 on the lower conductor layer 328 underlying the route 342 of the line 34 and over the segment 348 of the route 344 by the higher conductor layer.

Figure 5:
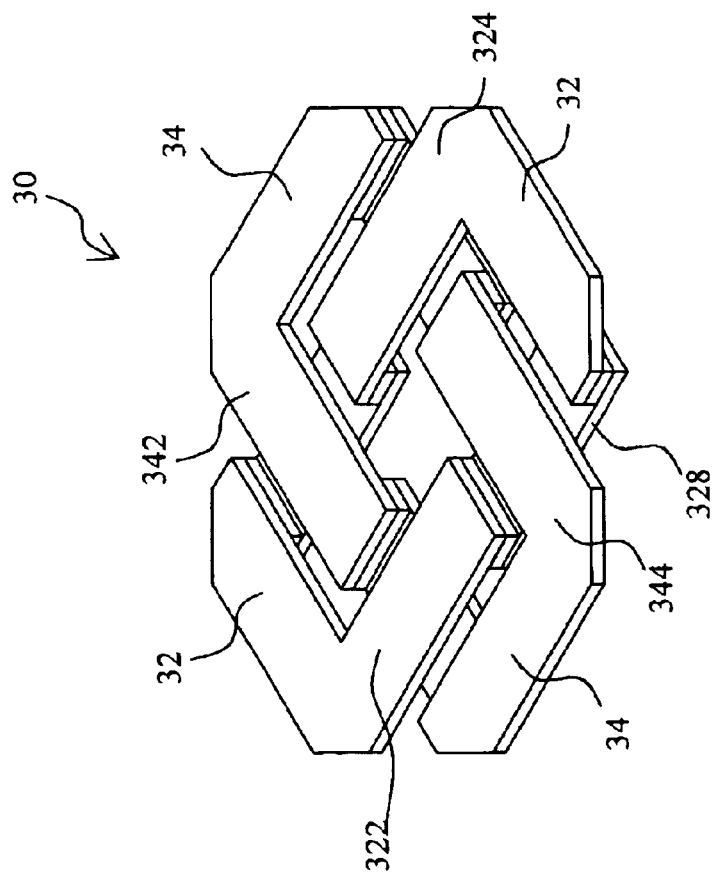
FIG. 5 shows the crossover structure of FIG. 4 in a more detailed manner.
Figure 6:
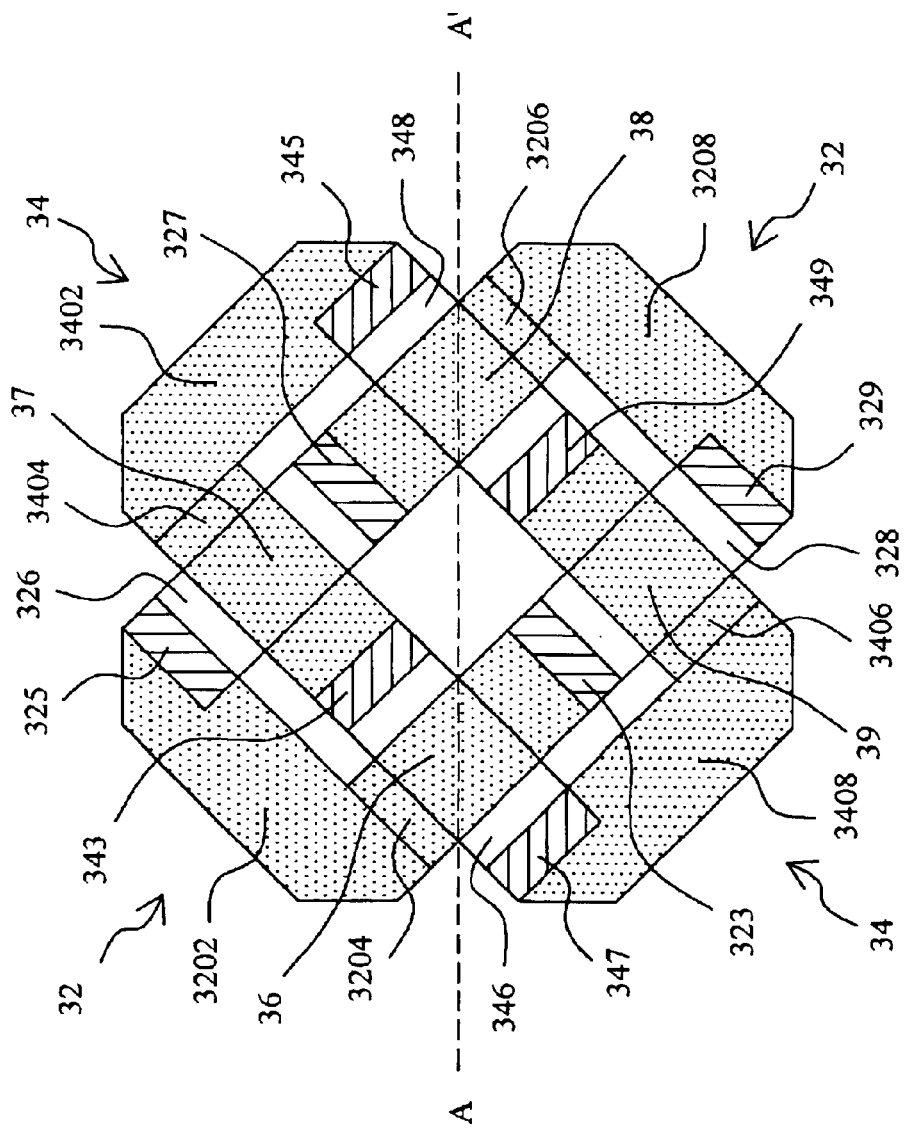
FIG. 6 shows a top view of the crossover structure of FIG. 4 when it is realized on a substrate.

For more detailed illustration, FIG. 5 shows a solid diagram for the crossover structure 30 and FIG. 6 shows a top view of this solid crossover structure 30, of which each line has six segments, i.e., the line 32 has segments 3202, 3204, 328, 3208, 3206 and 326, and the line 34 has segments 3402, 3404, 346, 3408, 3406 and 348. The first route 322 of the first line 32 includes segments 3202, 3204, 328 and 3208. The second route 324 of the first line 32 includes segments 3202, 326, 3206 and 3208. The first route 342 of the second line 34 includes segments 3402, 3404, 346 and 3408. The second route 344 of the second line 34 includes segments 3402, 348, 3406 and 3408. For the first route 322 of the first line 32, one end of the segment 3202 on the higher conductor layer is connected to the segment 3204 on the same higher conductor layer to cross over the segment 346 on the lower conductor layer of the first route 342 of the other line 34, and the segment 3204 is connected to the segment 328 on the lower conductor layer by the via 323 to cross over the segment 3406 on the higher conductor layer of the second route 344 of the second line 34. After crossing over the segment 3406, the segment 328 of the first line 32 is connected to the segment 3208 on the higher conductor layer by the via 329. For the second route 324 of the first line 32, the other end of the segment 3202 is connected to the segment 326 on the lower conductor layer by the via 325 to cross over the first route 342 of the second line 34, and the segment 326 is connected to the segment 3206 on the higher conductor layer by the via 327 to cross over the segment 348 on the lower conductor layer of the second route 344 of the second line 34. The segment 3206 is further connected to the other end of the segment 3208 on the same higher conductor layer. For the first route 342 of the second line 34, one end of the segment 3402 on the higher conductor layer is connected to the segment 3404 on the same higher conductor layer to cross over the segment 326 on the lower conductor layer of the second route 324 of the first line 32, and the segment 3404 is connected to the segment 346 on the lower conductor layer by the via 343 to cross over the segment 3204 on the higher conductor layer of the first route 322 of the first line 32. After crossing over the segment 3204, the segment 346 of the second line 34 is connected to the segment 3408 on the higher conductor layer by the via 347. For the second route 344 of the second line 34, the other end of the segment 3408 is connected to the segment 3406 on the same higher conductor layer to cross over the segment 328 of the first route 322 of the first line 32, and the segment 3406 is connected to the segment 3348 on the lower conductor layer by the via 349 to cross over the segment 3206 on the higher conductor layer of the second route 324 of the first line 32. The segment 348 is further connected to the other end of the segment 3402 on the higher conductor layer by the via 345. Specially, the four routes 322, 324, 342 and 344 of the two lines 32 and 34 form four crossover portions 36, 37, 38 and 39, and those crossover portions will result in parasitic capacitors symmetric to the center of the crossover structure 30.

Figure 7:
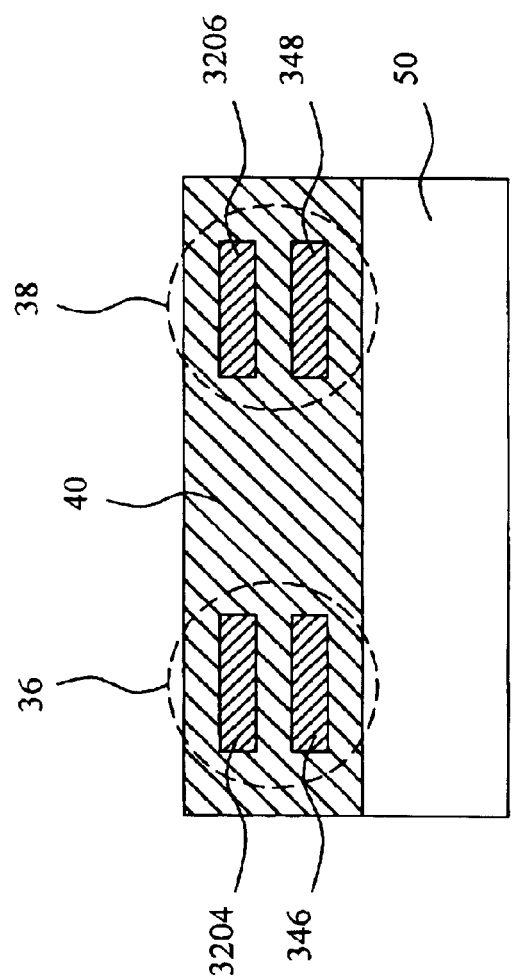
FIG. 7 shows a cross-sectional view of the crossover structure of FIG. 6 from the line AA' shown in FIG. 6.

FIG. 7 shows a cross-sectional view of the crossover structure 30 from the line AA' shown in FIG. 6. Above the substrate 50 to form the conductor lines 32 and 34 thereon, an insulator 40 encloses the crossover structure 30 for the purposes of insulation between and passivation of the conductor lines 32 and 34. In the crossover portions 36 and 38, the segments 3204 and 3206 of the first line 32 are formed of the higher conductor layer, and the segments 346 and 348 of the second line 34 are formed of the lower conductor layer. The cross-sectional view of the crossover structure 30 for the other two crossover portions 37 and 39, the profile is similar to that shown in FIG. 7, only that the segments 3404 and 3406 of the second line 34 are formed of the higher conductor layer, and the segments 326 and 328 of the first line 32 are formed of the lower conductor layer. Due to such symmetric arrangement in the crossover structure 30, the two lines 32 and 34 substantially have symmetric parasitic effect to the substrate 50.

Figure 8:
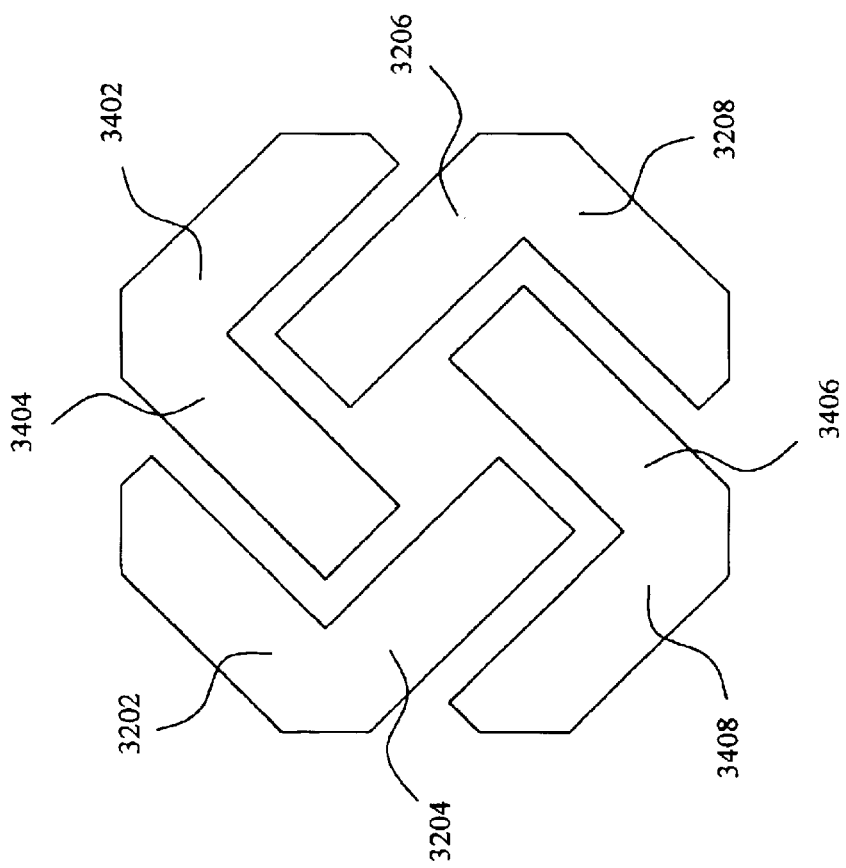
FIG. 8 shows the layout of the higher conductor layer in the crossover structure of FIG. 6.
Figure 9:
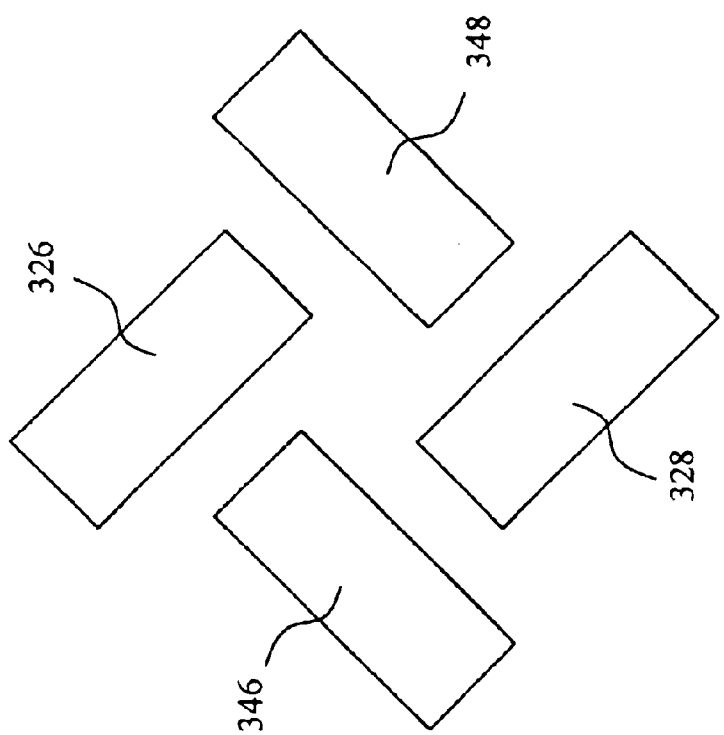
FIG. 9 shows the layout of the lower conductor layer in the crossover structure of FIG. 6.

For further illustration, FIG. 8 and FIG. 9 show the layouts of the higher conductor layer and the lower conductor layer, respectively, of the crossover structure 30 shown in FIG. 6. The segments 3202, 3204, 3206 and 3208 for the first line 32 and the segments 3402, 3404, 3406 and 3408 for the second line 34 are all formed of the higher conductor layer. The segments 326 and 328 for the first line 32 and the segments 346 and 348 for the second line 34 are all formed of the lower conductor layer.

Figure 10:
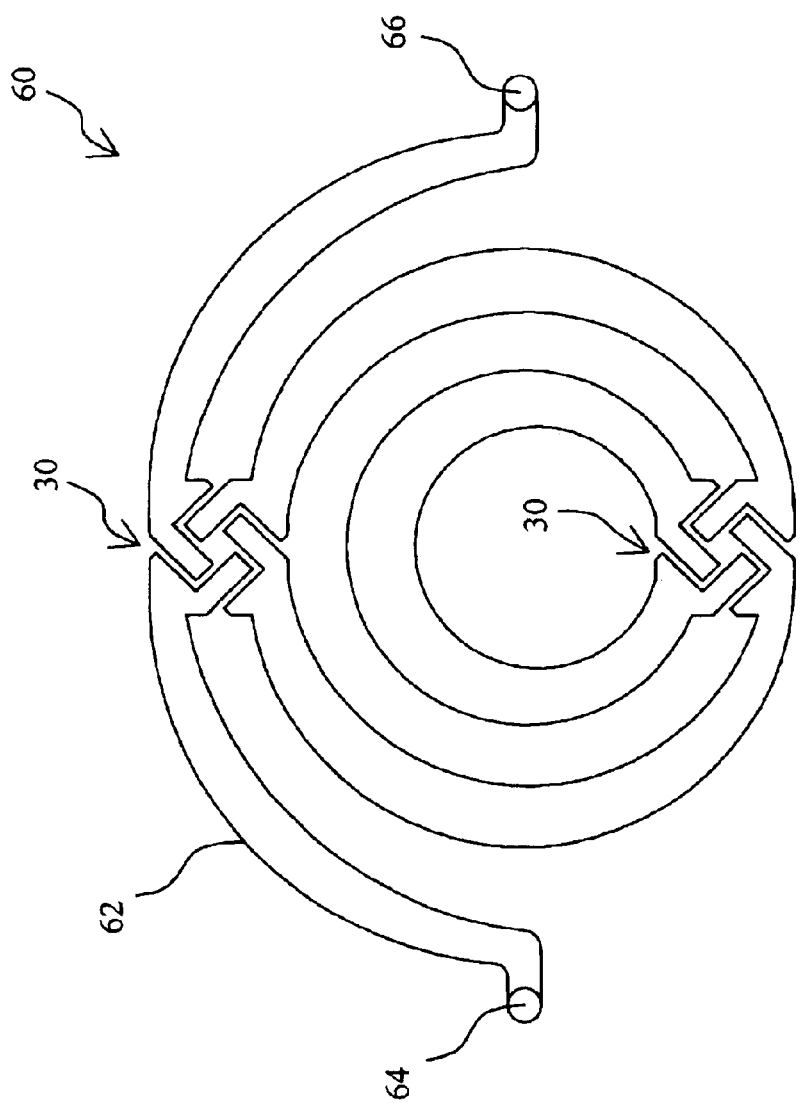
FIG. 10 shows a spiral inductor using the crossover structure of FIG. 6.
Figure 11:
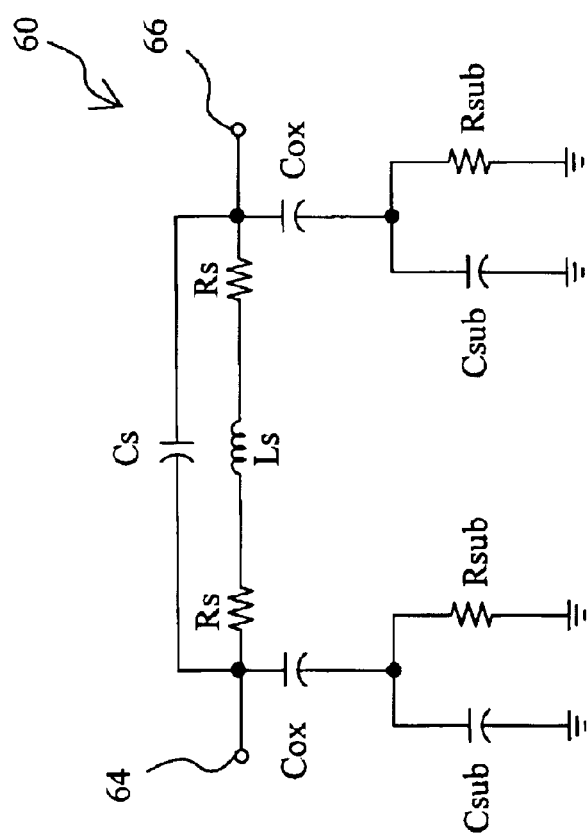
FIG. 11 shows an equivalent circuit of the spiral inductor shown in FIG. 10.

FIG. 10 shows a spiral inductor 60 using the crossover structure 30 shown in FIG. 5, in which a spiral winding 62 has two contacts 64 and 66 on the left and right sides, respectively, and two crossover structures 30 are employed. The left and right half portions of this spiral inductor 60 are symmetric to the center line thereof, and the two crossover structures 30 are also symmetric to the substrate containing the spiral inductor 60. FIG. 11 shows an equivalent circuit of the spiral inductor 60 shown in FIG. 10, of which the electric parameters are symmetric between the two ports 64 and 66 and to the substrate.

The inventive crossover structure 30 has wide applications for on-chip inductor and integrated circuit windings when the semmetricity is important to the device structure thereof, especially for high-frequency operations, such as in the field of wireless communications. For example, the balun transformer with improved substrate loss proposed by U.S. Pat. No. 6,380,821 issued to Imbornone et al. occupies large chip area. If the crossover structure 30 of the present invention is applied to replace the crossover portions of the Imbornone transformer, the chip area will be dramatically reduced.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. A symmetric crossover structure of two lines formed of a lower conductor layer and a higher conductor layer above a substrate, the structure comprising:
   a first line branched to a first route and a second route; and
   a second line branched to a third route and a fourth route;
   wherein the first route has a first segment to cross over the third route from the higher conductor layer and a second segment to cross over the fourth route from the lower conductor layer, the second route has a third segment to cross over the third route from the lower conductor layer and a fourth segment to cross over the fourth route from the higher conductor layer, the third route has a fifth segment to cross over the second route from the higher conductor layer and a sixth segment to cross over the first route from the lower conductor layer, and the fourth route has a seventh segment to cross over the second route from the lower conductor layer and an eighth segment to cross over the first route from the higher conductor layer.

2. The crossover structure of claim 1, wherein the first and third segments are connected together, the second and forth segments are connected together, the fifth and seventh segments are connected together, and the sixth and eighth segments are connected together.

3. The crossover structure of claim 1, wherein the first and sixth segments cross over to each other, the second and eighth segments cross over to each other, the third and fifth segments cross over to each other, and the fourth and seventh segments cross over to each other.

4. The crossover structure of claim 1, wherein the first and second routes form a first parasitic capacitor, and the third and fourth routes form a second parasitic capacitor.

5. The crossover structure of claim 4, wherein the first and second parasitic capacitors are symmetric to the center of the crossover structure.

* * * * *